(12) United States Patent
Adusumilli et al.

(10) Patent No.: US 10,304,938 B2
(45) Date of Patent: May 28, 2019

(54) MASKLESS METHOD TO REDUCE SOURCE-DRAIN CONTACT RESISTANCE IN CMOS DEVICES

(71) Applicant: International Business Machines Corporation, Armonk, NY (US)

(72) Inventors: Praneet Adusumilli, Albany, NY (US); Hemanth Jagannathan, Niskayuna, NY (US); Christian Lavoie, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 15/254,302

(22) Filed: Sep. 1, 2016

(65) Prior Publication Data

US 2018/0061956 A1    Mar. 1, 2018

(51) Int. Cl.
| | |
|---|---|
| *H01L 29/45* | (2006.01) |
| *H01L 21/3215* | (2006.01) |
| *H01L 21/265* | (2006.01) |
| *H01L 21/8238* | (2006.01) |
| *H01L 21/223* | (2006.01) |
| *H01L 21/24* | (2006.01) |
| *H01L 27/092* | (2006.01) |
| *H01L 29/167* | (2006.01) |
| *H01L 29/78* | (2006.01) |
| *H01L 21/285* | (2006.01) |

(52) U.S. Cl.
CPC .......... *H01L 29/45* (2013.01); *H01L 21/2236* (2013.01); *H01L 21/244* (2013.01); *H01L 21/265* (2013.01); *H01L 21/285* (2013.01); *H01L 21/3215* (2013.01); *H01L 21/823871* (2013.01); *H01L 27/092* (2013.01); *H01L 29/167* (2013.01); *H01L 29/78* (2013.01); *H01L 21/823814* (2013.01)

(58) Field of Classification Search
CPC . H01L 21/265; H01L 29/665; H01L 29/6659; H01L 21/28518; H01L 21/823814
See application file for complete search history.

(56) References Cited

U.S. PATENT DOCUMENTS

| | | |
|---|---|---|
| 4,107,835 A | 8/1978 | Bindell et al. |
| 6,150,243 A | 11/2000 | Wieczorek et al. |
| (Continued) | | |

*Primary Examiner* — Tom Thomas
*Assistant Examiner* — John Bodnar
(74) *Attorney, Agent, or Firm* — Fleit Gibbons Gutman Bongini Bianco PL; Jose Gutman

(57) ABSTRACT

Various methods and semiconductor structures for fabricating an FET device having Nickel atoms implanted in a silicide metal film on a source-drain contact region of the FET device thereby reducing resistance of the source-drain contact region of the FET device. An example fabrication method includes maskless blanket implantation of Nickel atoms across a semiconductor wafer. Nickel atoms can be implanted into silicide metal film of a source-drain contact region of nFET devices, pFET devices, or both, on a semiconductor wafer. Nickel atoms can be implanted into silicide metal film on a source-drain contact region of nFET devices and pFET devices. The silicide metal film on the source-drain contact region of the nFET device being a different material than the silicide metal film on the source-drain contact region of the pFET device.

18 Claims, 7 Drawing Sheets

(56) References Cited

U.S. PATENT DOCUMENTS

| | | | |
|---|---|---|---|
| 6,262,486 B1 | 7/2001 | Farrar | |
| 6,380,057 B1 | 4/2002 | Buynoski et al. | |
| 7,217,657 B2 | 5/2007 | Wieczorek et al. | |
| 7,611,943 B2 | 11/2009 | Liu | |
| 8,816,448 B2 | 8/2014 | Nishi et al. | |
| 2003/0160198 A1* | 8/2003 | Wieczorek | H01L 21/28052 |
| | | | 251/100 |
| 2003/0230811 A1* | 12/2003 | Kim | H01L 21/823814 |
| | | | 257/758 |
| 2005/0253205 A1* | 11/2005 | Kawamura | H01L 21/28518 |
| | | | 257/412 |
| 2005/0280098 A1 | 12/2005 | Shin et al. | |
| 2008/0237603 A1 | 10/2008 | Lodha et al. | |
| 2008/0237743 A1 | 10/2008 | Ramin et al. | |
| 2012/0153350 A1 | 6/2012 | Kronholz et al. | |
| 2012/0153359 A1* | 6/2012 | Frye | H01L 21/28518 |
| | | | 257/213 |
| 2016/0141243 A1* | 5/2016 | You | H01L 23/5226 |
| | | | 257/369 |
| 2016/0358916 A1 | 12/2016 | Adusumilli et al. | |
| 2017/0256624 A1 | 9/2017 | Lee et al. | |

\* cited by examiner

MASKLESS METHOD TO REDUCE SOURCE-DRAIN CONTACT RESISTANCE IN CMOS DEVICES

BACKGROUND OF THE INVENTION

The present invention generally relates to the field of semiconductors, and more particularly relates to a method of fabricating semiconductor structures having source-drain silicide interface contacts with reduced contact resistance.

Silicide/source-drain interface resistance is a major contributor to the total external parasitic resistance of a semiconductor contact. As the source-drain contact dimensions are aggressively scaled, new approaches/methods are needed to reduce the interface resistance.

SUMMARY OF THE INVENTION

A method for fabrication of semiconductor structures by implanting Nickel atoms in silicide metal on epitaxially grown source-drain contact region of an FET device is provided.

According to one embodiment, a method for fabricating a semiconductor structure reduces source-drain contact resistance in nFET devices and/or pFET devices. The method includes implanting Nickel atoms in a silicide metal on an epitaxially grown source-drain contact region of an FET device thereby reducing resistance of the source-drain contact region. The FET device can be an nFET device or a pFET device. The silicide metal on the epitaxially grown source-drain contact region of an nFET device can be a different silicide metal material from that of a silicide metal on the epitaxially grown source-drain contact region of a pFET device.

The fabrication method can include blanket implantation of Nickel atoms across a wafer. This reduces cost, increases processing speed, and simplifies a semiconductor fabrication process.

According to another embodiment, a semiconductor structure includes a substrate; an epitaxially grown source-drain contact region of at least one FET device disposed on the substrate; and a silicide metal film on the epitaxially grown source-drain contact region of the at least one FET device, the silicide metal film including implanted Nickel atoms reducing resistance of the source-drain contact region of the at least one FET device.

The FET device can be an nFET device or a pFET device.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
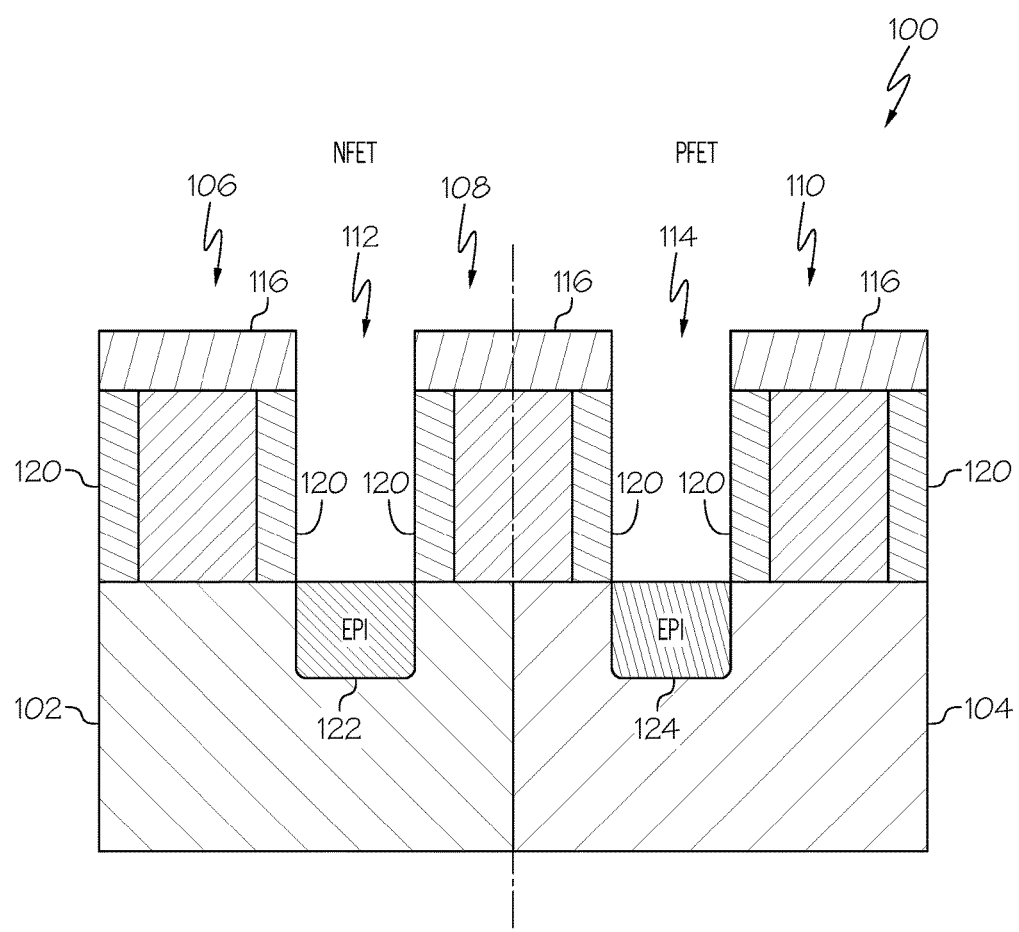
FIG. 1 is a cross-sectional view of a partial semiconductor structure in a first step of an example process of fabricating semiconductor devices, according to an embodiment of the present invention.

It is to be understood that the present invention will be described in terms of given illustrative example processes for fabricating source-drain silicide interface contacts in semiconductor devices. However, other semiconductor architectures, structures, substrate materials, and process features and steps can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present example embodiments include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments of the present invention include a semiconductor structure having source contacts and drain contacts on the same wafer. This semiconductor structure can be used to create CMOS devices in an integrated circuit.

Silicide/source-drain interface resistance is a major contributor to the total external parasitic resistance of source-drain contacts. One way to achieve low contact resistance is to improve the activation of dopants in the source-drain semiconductor substrate and thereby lowering the Schottky barrier height and specific contact resistivity.

The inventors have discovered that dopants present at the silicon-silicide interface of a source-drain contact region can be activated ahead of a nickel-silicon-silicide (NiSi/Si) interface at low temperature (500 to 600 C range). Specifically, Arsenic dopants were found to be activated ~1.5 nm from the silicide/Si interface on the Si side. A significant lowering of Schottky barrier height (up to 100 meV) was observed for both Boron and Arsenic dopant-segregation samples.

But concerns about Ni diffusion based defectivity and negative yield impact have precluded the use of traditional NiSi or NiPtSi contacts in aggressively scaled 3D CMOS devices.

However, it is possible to still utilize this mechanism to reduce Schottky barrier height by implanting Ni in the silicide and anneal to carefully position it at the silicide/Si interface. With only a small amount of nickel (Ni) being implanted, the risk of piping defectivity is greatly mitigated. Implanted Ni concentration can be, for example, in the range of 1E20/cm3 to 1E22/cm3. This range is provided only as an example, and higher or lower Ni concentrations may be possible.

Ni implants can be used for both nFET and pFET devices as Ni is found to help with low temperature activation of both Boron and Arsenic. Dopants are already maximized at the interface through prior processing in a fabrication process. For example, Boron and Arsenic dopant concentration at the interface can be in the range of 1E20/cm3 to 1E22/cm3, which is then activated by nickel implantation at a nickel dopant concentration in the range of 1E20/cm3 to 1E22/cm3. Ni facilitates further/additional activation of these dopants at the interface. No mask is required for this purpose—thus making this an inexpensive solution to implement.

Additionally, this mechanism is compatible with dual silicide contacts. That is, nickel atom implantation into silicide metal, sufficient to reduce the source-drain contact region resistance, can be achieved in separate contact materials for nFET devices and pFET devices. According to various embodiments, the nickel atoms can be contemporaneously implanted into both separate contact materials for nFET devices and pFET devices. This results in an inexpensive solution to implement in a semiconductor fabrication process.

Alternative embodiments include: a) silicide metals alloyed with a few atomic percent of Ni and deposited via physical vapor deposition (PVD), and b) deposition of an extremely thin layer of Ni post silicide formation; where Ni will diffuse to the silicide/Si interface via grain boundary diffusion.

Referring now to the drawings in which like numerals represent the same of similar elements, FIG. 1 shows an example of a semiconductor substrate structure. The invention, according to various embodiments, provides a novel semiconductor structure and novel method of fabricating source and drain contacts with extremely low resistance using implantation of nickel atoms. The method can create very low contact resistance for source and drain contacts in both nFET and pFET devices on a semiconductor substrate such as used in a CMOS semiconductor architecture.

In this example, the nickel atoms are implanted at the interface material between the conductor contact material and the epitaxially grown semiconductor material in the source and drain regions.

FIG. 1 shows a semiconductor structure 100 having an nFET region 102 on a substrate (not shown) and a pFET region 104 on the substrate. In FIG. 1, a semiconductor fabrication process is at a point in which there has already been fabricated gate stack contacts (also referred to as gate contacts or gate regions) 106, 108, 110, separated by source and drain contact regions (also more generally referred to as source/drain contacts) 112, 114. It should be noted that use of the more general term "source/drain contacts" 112, 114, typically refers to the complete metallization of interconnects of the contacts 112, 114, but it also can refer to any portion thereof. In the nFET region 102 there is a source/drain contact region (not shown) to the left of the gate stack contact 106. In the pFET region 104 there is a source/drain contact region (not shown) to the right of the gate contact 110. For each gate stack contact 106, 108, 110, there is a nitride cap 116 and nitride spacers 120.

Epitaxially grown source-drain contact regions 122 have been formed in the nFET region 102 and epitaxially grown source-drain contact regions 124 have been formed in the pFET region 104. For example, the source-drain contact regions 122 formed in the nFET region 102 can include phosphorous-doped silicon material (Si(P)). The source-drain contact regions 124 formed in the pFET region 104 can include Boron-doped Silicon-Germanium material (SiGe (B)) or a Boron-doped Germanium material.

Figure 2:
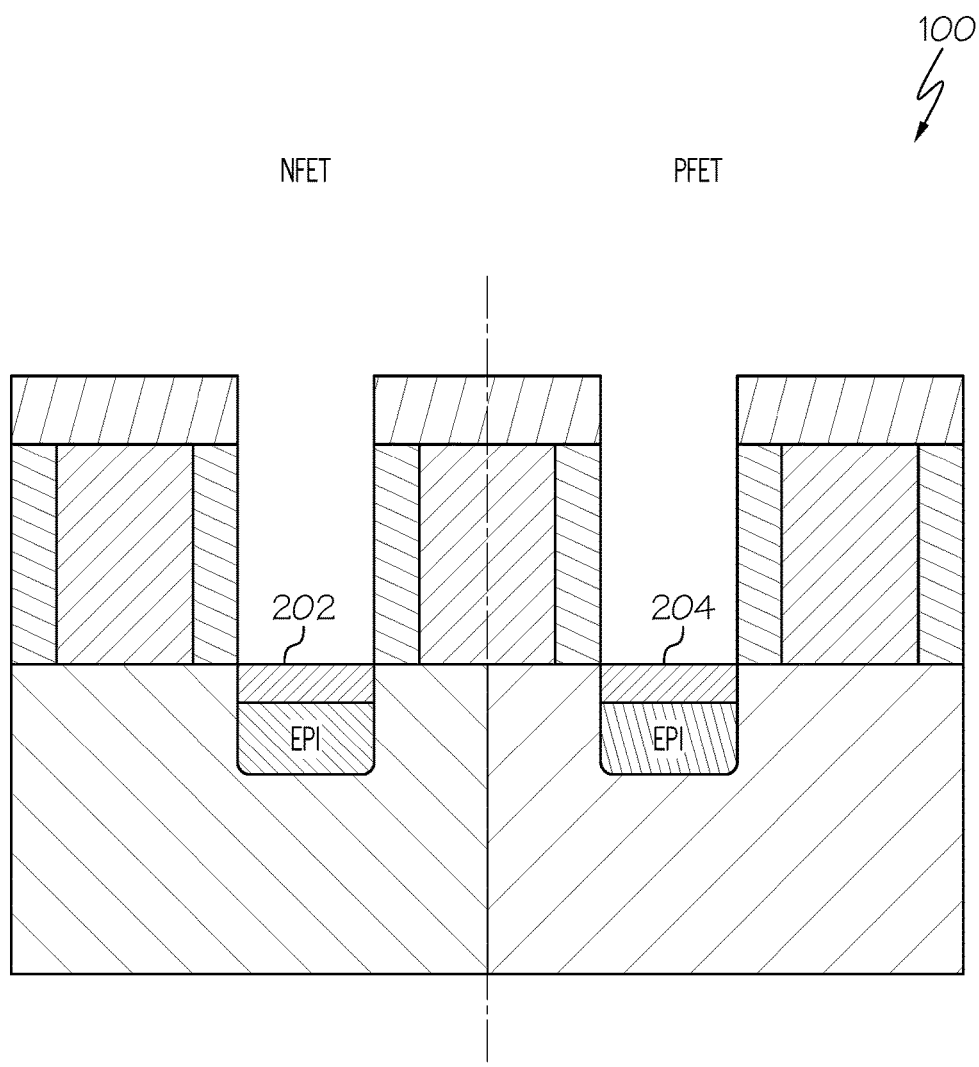
FIG. 2 is a cross-sectional view of the partial semiconductor structure in a second step of the continuing example process of fabricating semiconductor devices, according to an embodiment of the present invention.

FIG. 2 illustrates a subsequent point in the example fabrication process after having deposited a silicide metal film 202 on the epitaxially grown source-drain contact regions 122 in the nFET region 102, and after having deposited a silicide metal film 204 on the epitaxially grown source-drain contact regions 124 in the pFET region 104. The deposition can be by, for example, physical vapor deposition (PVD) or chemical vapor deposition (CVD), or a combination of both methods.

As an example, the silicide metal film 202, 204 deposited on the respective epitaxially grown source-drain contact regions 122, 124 can include Titanium. Then, the fabrication process performs an anneal of the deposited Titanium to form Titanium silicide.

On the source-drain contact regions 122 in the nFET region 102 it forms a silicide metal film (e.g., a Titanium silicide film) 202. On the source-drain contact regions 124 in the pFET region 104 it forms a silicide metal film (e.g., a film including a mixture of Titanium silicide/germanide also known as Titanium germanosilicide (TiSixGey)) 204. In certain embodiments if the epitaxially grown source-drain contact regions 124 in the pFET region 104 contain pure germanium then the silicide metal film 204 formed on such source-drain contact regions 124 includes Titanium germanide alone.

After the silicidation anneal forms the silicide metal film 202, 204 on the respective source-drain contact regions 122, 124, the fabrication process selectively strips (removes) any unreacted titanium metal from the semiconductor structure 100. The process removes unreacted metal from all across the wafer. This removal of unreacted Titanium is done, for example, by using a wet chemistry for selective removal of unreacted metal, such as a Sulfuric Peroxide mixture. The Sulfuric Peroxide mixture is made by mixing Sulfuric Acid (H2SO4) with Hydrogen Peroxide (H2O2), such as a 3:1 mixture of concentrated sulfuric acid (H2SO4) with hydrogen peroxide (H2O2).

Figure 3:
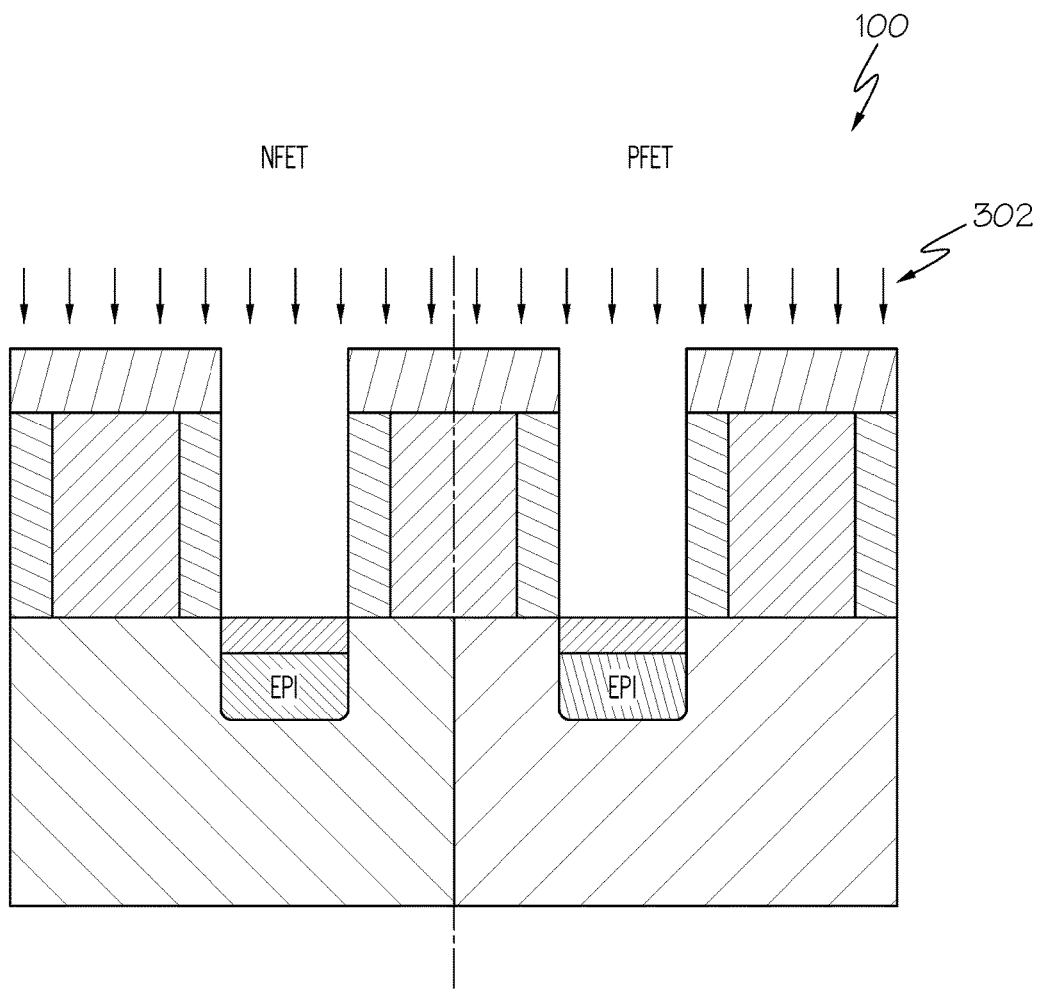
FIG. 3 is a cross-sectional view of the partial semiconductor structure in a third step of the continuing example process of fabricating semiconductor devices, according to an embodiment of the present invention.

According to the present example, after the selective removal of unreacted titanium metal, the fabrication process performs a shallow nickel atom implantation 302 on the silicide metal film 202, 204, as shown in FIG. 3. Nickel atoms can be implanted in the silicide metal film 202 on the source-drain contact regions 122 in the nFET region 102, or in the silicide metal film 204 on the source-drain contact regions 124 in the pFET region 104, or contemporaneously implanted in both silicide metal films 202, 204, in the respective nFET region 102 and pFET region 104.

Nickel atom implantation can be achieved by beamline implanting or by plasma doping techniques. Beamline implanting (e.g., beamline implanting of Nickel atoms in the silicide metal film on the epitaxially grown source-drain contact region of an FET device) typically are line of sight implantation techniques. Plasma doping techniques (e.g., plasma doping of Nickel atoms in the silicide metal film on the epitaxially grown source-drain contact region of an FET device) can cover both line-of-sight implantation and non-line-of-sight implantation.

A third alternative way of implanting nickel atoms into the silicon-silicide interface is by depositing a very thin film of nickel on top of the silicide metal film 202, 204, after the silicide formation shown in FIG. 2. In this example, the very thin film of nickel, such as between 10 A to 40 A, is deposited on the silicide metal film 202, 204, after the anneal and the selective strip of unreacted metal discussed above. Nickel has a very high diffusion coefficient or mass transport coefficient. The fabrication process uses grain boundary diffusion of the nickel atoms in the silicide metal film 202, 204, to achieve the implantation of the nickel atoms into the silicon-silicide interface.

A fourth alternative way of implanting nickel atoms into the silicon-silicide interface is where the silicide metal is alloyed with a few atomic percent (such as 0.5% to 5%) of nickel. For example, a silicide metal alloy can be titanium nickel alloy. The silicide metal, alloyed with a few atomic percent of nickel, is deposited as silicide metal film 202, 204, via physical vapor deposition (PVD). The anneal silicides the titanium metal film 202, 204, which includes the few atomic percent of nickel. The fabrication process then uses grain boundary diffusion of the nickel atoms in the silicide metal film 202, 204, to achieve the implantation of the nickel atoms into the silicon-silicide interface.

The inventors have discovered that having nickel atoms implanted 302, 402, 404, at an interface region between, and/or possibly including a portion of, the silicide metal film 202, 204, and the respective epitaxially grown source-drain contact region 122, 124, can activate more dopant atoms in the epitaxially grown source-drain contact region 122, 124, resulting in a lower contact resistance. It should be noted that contact resistance depends on many factors such as area of the contact structure, presence or absence of interfacial oxides, dopant concentration, etc. However, everything else being equal, contact resistance will be lower with Ni implantation as compared to without Ni implantation.

This lower contact resistance is also referred to as reduced interfacial resistivity of the contact regions 122, 124. Nickel atoms implanted 302 at the silicon-silicide interface region are useful for lowering contact resistance of both nFET and pFET contact regions 122, 124. Nickel atom implantation 302 can be performed in a fabrication process for a single silicide contact (e.g., where there is a single contact material used such as for nFET devices or pFET devices), or in a fabrication process for dual silicide contacts (e.g., where there are different contact materials used in nFET and pFET devices). Dopants at the interface region can be activated by nickel implantation at a nickel dopant concentration in the range of 1E20/cm3 to 1E22/cm3 for both nFET and pFET devices.

According to various embodiments, a blanket (without a mask, also referred to as maskless) shallow implantation of nickel atoms can be performed across the entire wafer. The implantation would contemporaneously implant nickel atoms on both nFET and pFET regions 102, 104, across the entire wafer.

Of course, according to the present example, the implantation of nickel atoms that reduces the resistance of source-drain contact regions 122, 124, can also be done using masks. That is, for example, a mask can be applied to the nFET region 102 to implant nickel atoms in the pFET region 104. A mask, as another example, can be applied to the pFET region 104 to implant nickel atoms in the nFET region 102.

Figure 4:
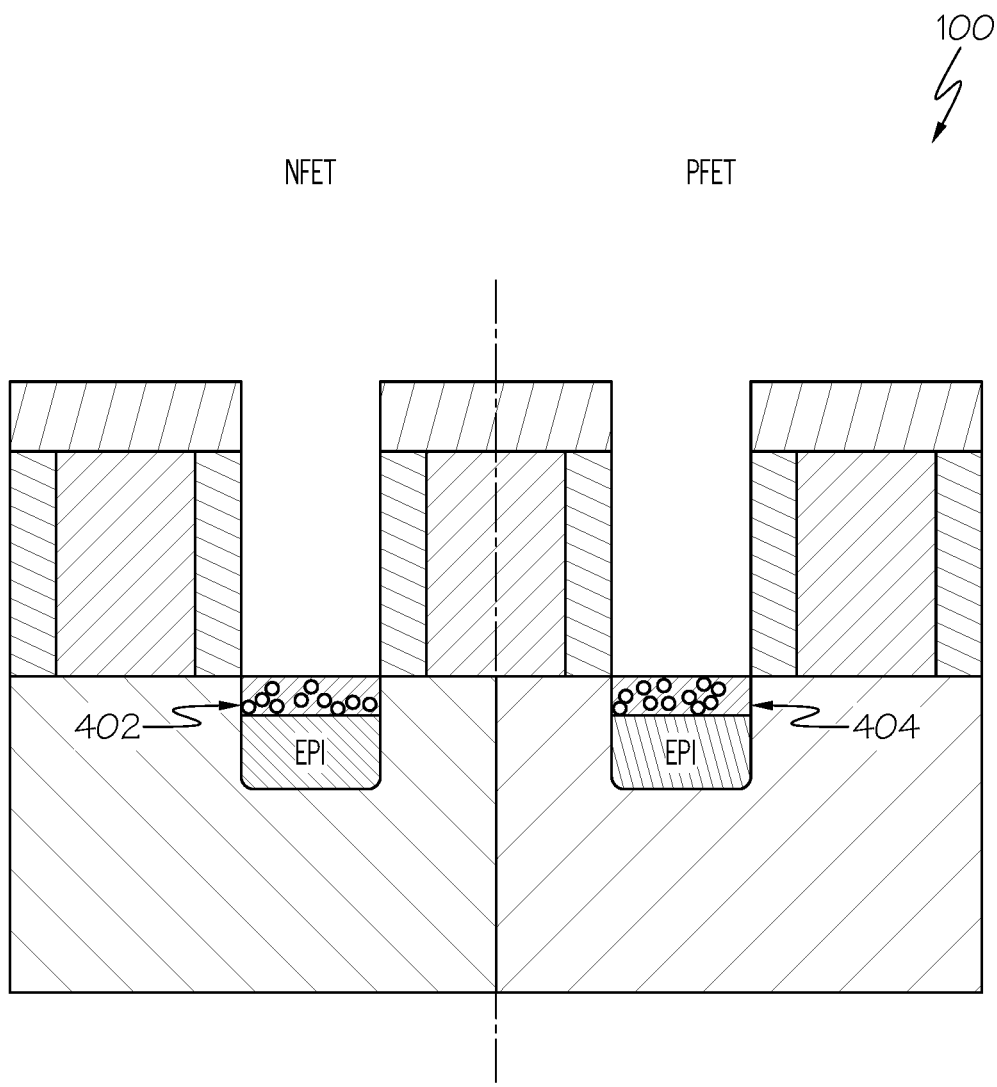
FIG. 4 is a cross-sectional view of the partial semiconductor structure in a fourth step of the continuing example process of fabricating semiconductor devices, according to an embodiment of the present invention.

Another type of metal atoms, other than nickel atoms, can be implanted at the interface region to reduce the resistance of source-drain contact regions 122, 124. However, the inventors have discovered that nickel atoms implantation works effectively to reduce the resistance of source-drain contact regions 122, 124 in both the nFET region 102 and the pFET region 104. Therefore, according to various embodiments, a blanket shallow implantation of nickel atoms can be done across the entire wafer. FIG. 4 illustrates an example of nickel atoms 402, 404 implanted and activated in the respective interface region between, and/or possibly including a portion of, the respective silicide metal film 202, 204 and the respective epitaxially grown source-drain contact region 122, 124.

There are several advantages of a fabrication process that performs blanket maskless implantation of nickel atoms across the entire wafer. These advantages include: 1) the fabrication process does not have to use two different species of metal atoms to implant a first species in the source-drain contacts 122 in the nFET region 102 and separately implant a second different species in the source-drain contacts 124 in the pFET region 104 to obtain this reduced contact resistance effect; 2) the fabrication process is much easier; 3) the fabrication process does not have to use masks for implanting the nickel atoms across the entire wafer; 4) the fabrication process has reduced cost; 5) the fabrication process has reduced complexity; and 6) the fabrication process has a reduced number of steps which makes it faster to process wafers.

After implanting the nickel atoms across the wafer, the fabrication process can optionally anneal the wafer in order to activate the dopants at the interface region between, and/or possibly including a portion of, the silicide metal film 202, 204 and the respective epitaxially grown source-drain contact region 122, 124. The activation of the dopants at the interface region results in a lower contact resistance.

It should be noted that, depending on the thermal budget of the subsequent fabrication processing of the wafer according to various embodiments, the downstream regular thermal budget during subsequent steps in the fabrication process can achieve activation of the dopants at the interface region. The activation of the dopants, according to these various embodiments, is achieved without performing the optional anneal of the wafer discussed above.

One additional observation is that during the nickel atom implantation, as shown in FIG. 3, there can be nickel atoms implanted into the nitride cap 106, 108, 110, and possibly into the nitride spacers 120. However, the nickel atoms implanted into the nitride cap and nitride spacers will not affect the electrical operation of the resulting semiconductor structure 100. Additionally, during a subsequent chemical mechanical polishing (CMP) operation, as will be discussed with reference to FIGS. 5 and 6, nickel atoms implanted into the top of the nitride cap 106, 108, 110, will be polished and removed or significantly reduced from the nitride cap 106, 108, 110.

Figure 5:
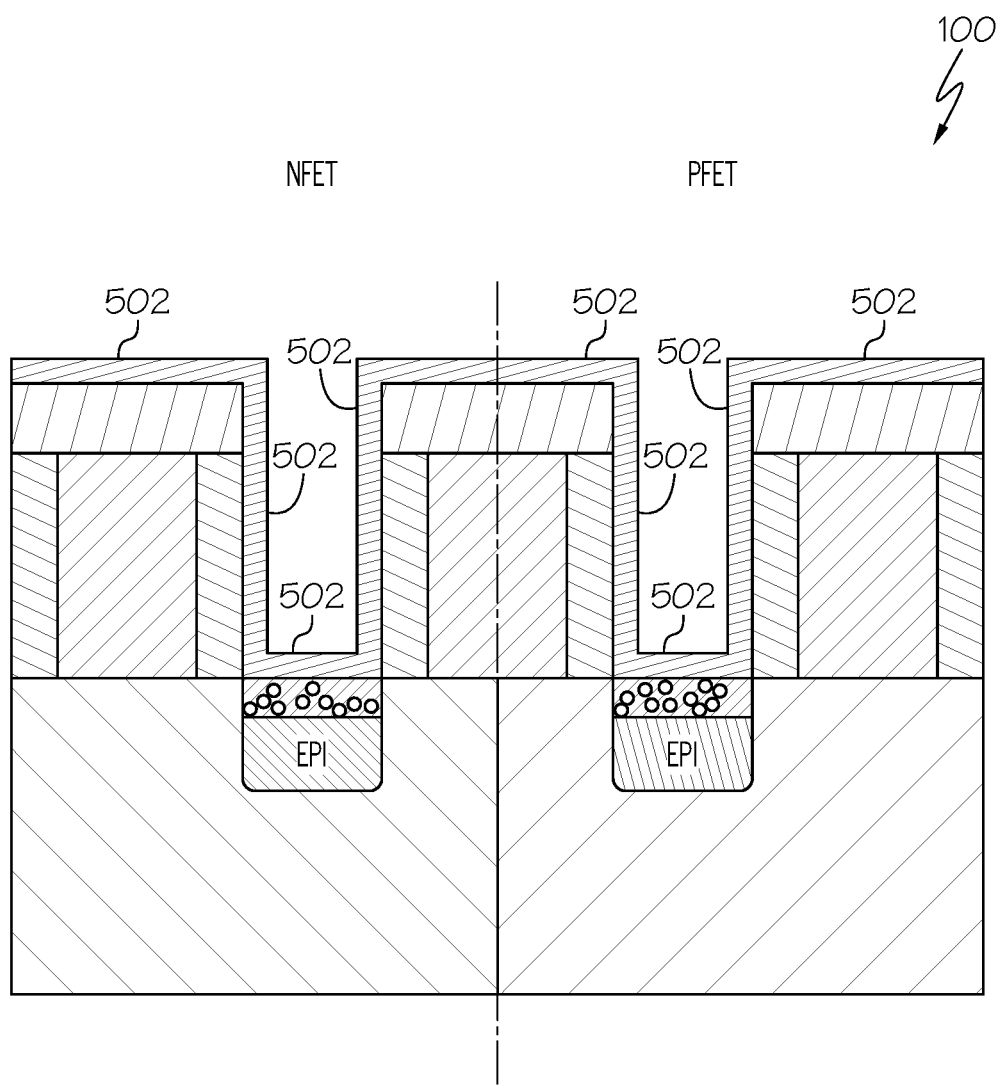
FIG. 5 is a cross-sectional view of the partial semiconductor structure in a fifth step of the continuing example process of fabricating semiconductor devices, according to an embodiment of the present invention.

Continuing with the example fabrication process, as shown in FIG. 5, there is metallization of the local interconnect at the source and drain contact regions 112, 114. First, there is deposition of a liner/barrier stack film 502 into the source and drain contact regions 112, 114. The liner can be, for example, a titanium film deposited and formed across the walls of the spacers 120 in the source and drain contact regions 112, 114. The barrier film can be, for example, a conformal titanium nitride deposition on the silicide metal film 202, 204. The liner deposition is primarily by a physical vapor deposition (PVD) technique. The titanium nitride deposition for the barrier film is primarily by an atomic layer deposition (ALD).

Figure 6:
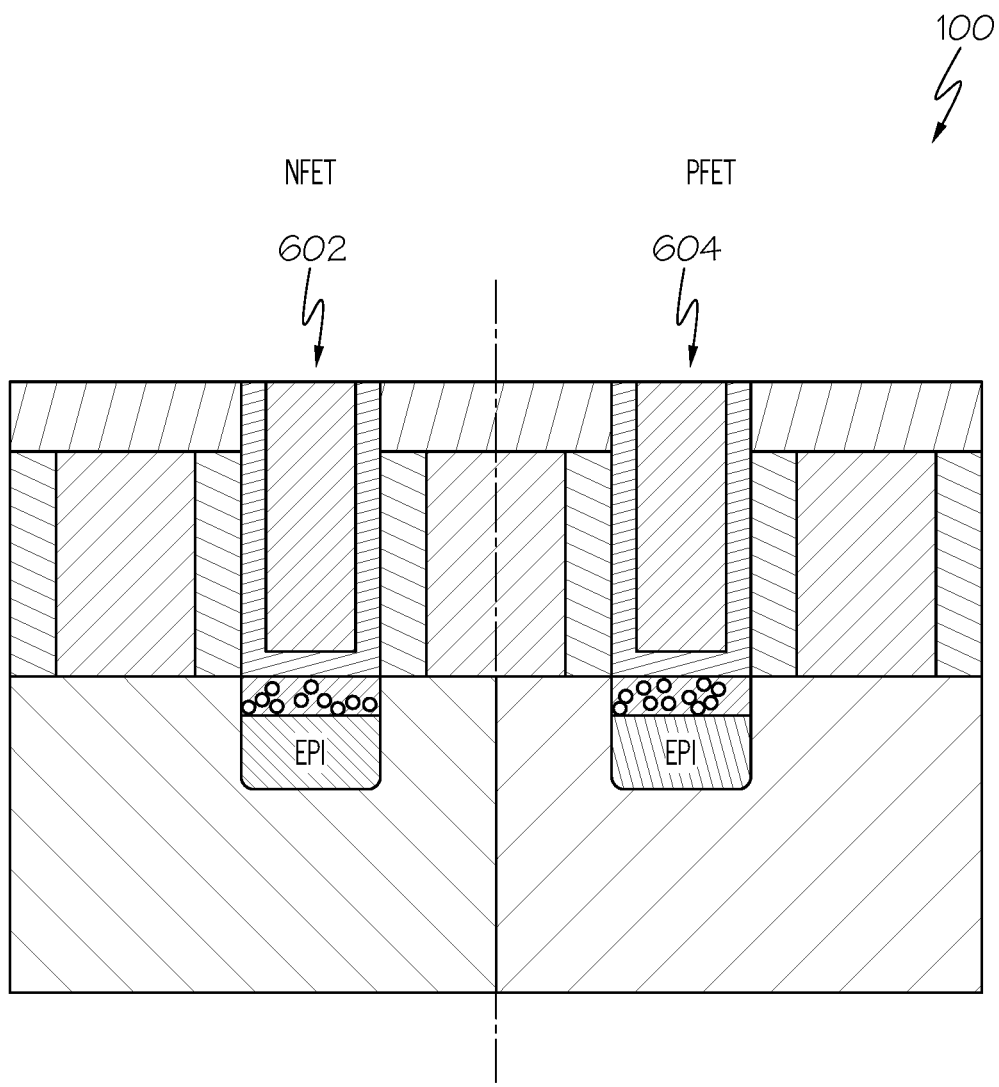
FIG. 6 is a cross-sectional view of the partial semiconductor structure in a sixth step of the continuing example process of fabricating semiconductor devices, according to an embodiment of the present invention.

After the deposition of a liner/barrier stack film 502 into the source and drain contact regions 112, 114, as shown in FIG. 6, there is a metal gap fill 602, 604, forming trench metal contacts to complete the metallization of the interconnects. In this example, this is a tungsten metal fill deposited by chemical vapor deposition (CVD) technique.

There will be a certain overburden of tungsten metal on top of the wafer from the CVD deposition of the tungsten metal fill. The fabrication process, according to the example, performs a chemical mechanical planarization (CMP) that polishes and removes the excess tungsten metal (and removes any liner 502 present on top of the self-aligned contact (SAC) nitride cap layer as shown in FIG. 5) from the top of the wafer. The resulting semiconductor structure, after performing the CMP, is shown in FIG. 6.

It should be noted that liner 502 was deposited inside and outside the trench contact structure 112, 114. Thus, liner 502 will be present on top of the SAC nitride cap layer 106, 108, 110, and is removed by performing the CMP to give a final structure where liner is solely present in the trench as shown in FIG. 6.

The nickel atoms 402, 404 implanted and activated in the respective interface region between, and/or possibly including a portion of, the respective silicide metal film 202, 204 and the respective epitaxially grown source-drain contact region 122, 124, effectively reduce the resistance of the source-drain contact regions 122, 124, in both the nFET region 102 and the pFET region 104. The inventors have discovered that the nickel atoms implanted 302, 402, 404, at the interface region effectively reduce the Schottky barrier height at the silicon-silicide interface. The lower the barrier height at the silicon-silicide interface the lower the contact resistance of the source/drain contacts 112, 114.

Figure 7:
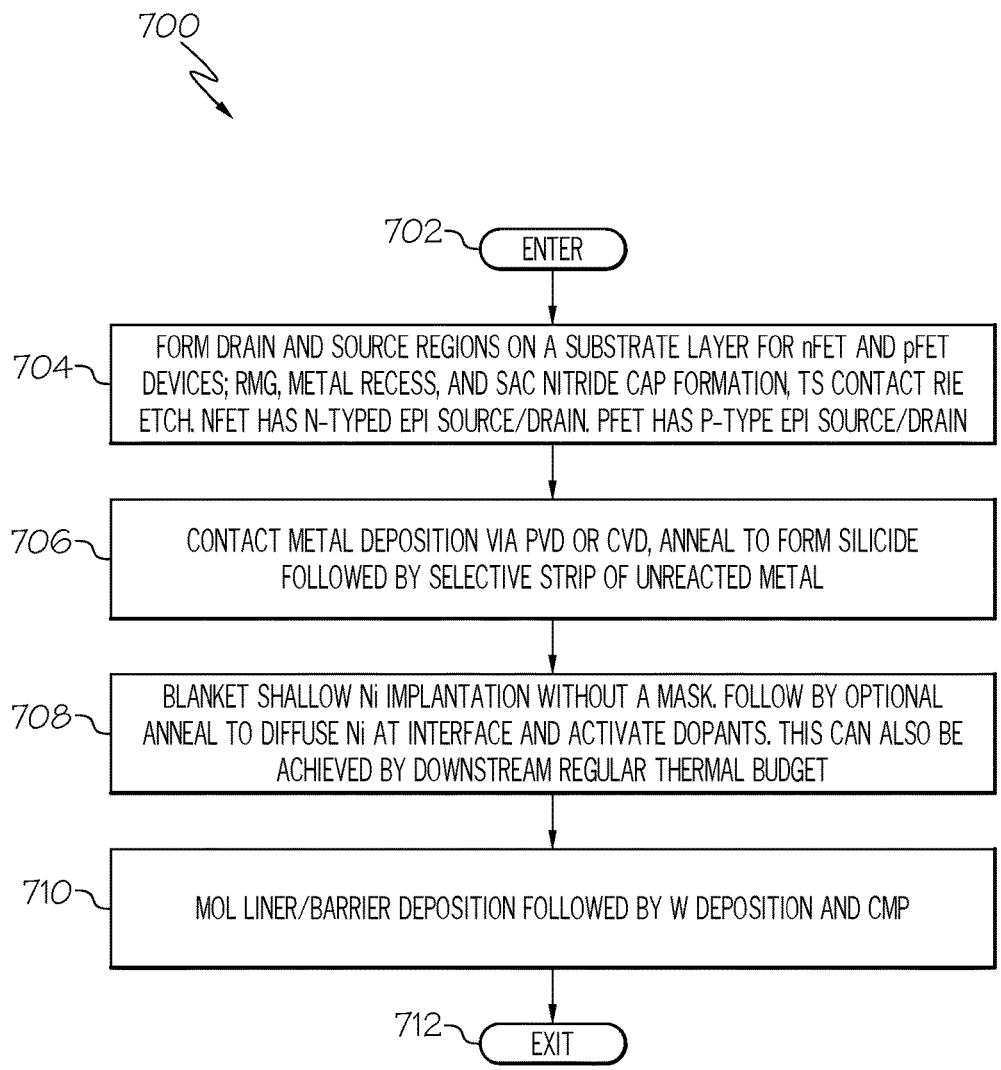
FIG. 7 is an operational flow diagram illustrating an example process for fabricating semiconductor devices, according to an embodiment of the present invention.

With reference to FIG. 7, an example process of fabricating semiconductor devices will be discussed below. The fabrication process is entered, at step 702, and it proceeds to, at step 704, fabricate drain and source regions on a substrate layer for nFET and pFET devices. Gate stacks can be formed such as by replacement metal gate (RMG) process. Metal recesses, self aligned contact (SAC) nitride caps, and spacers are formed. Also, trench silicide (TS) contact formation and reactive ion etching (RIE) can be used in a fabrication process to form a semiconductor structure such as shown in FIG. 1.

The example fabrication process continues, at step 706, with source/drain contact metal deposition via PVD or CVD, followed by an anneal to form silicide. This is then followed by selective strip of unreacted metal.

Then, at step 708, the process performs a blanket shallow nickel implantation without a mask. Following the nickel implantation, an optional anneal of the wafer is performed to diffuse nickel atoms at silicon-silicide interface and to activate dopants. This activation of dopants can alternatively be achieved by downstream regular thermal budget of the wafer.

The process, at step 710, performs a middle-of-line (MOL) liner/barrier deposition followed by Tungsten metal deposition to complete metallization of interconnects at the source/drain contacts. See, for example, FIGS. 5 and 6 and the associated discussion above. Chemical mechanical polishing can be performed on the wafer to remove excess Tungsten metal (and to remove liner deposited outside of the trench contact structure 112, 114). The fabrication process is then exited, at step 712.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements can apply to some inventive features but not to others.

What is claimed is:

1. A method for fabricating a semiconductor structure that reduces source-drain contact resistance in nFET devices and/or pFET devices, the method comprising: implanting Nickel atoms into a Titanium containing silicide metal film on an epitaxially grown source-drain contact region of the at least one FET device thereby reducing interfacial contact resistance of the epitaxially grown source-drain contact region.

2. The method of claim 1, wherein the at least one FET device is a plurality of FET devices, and the implanting comprises maskless contemporaneous implanting of Nickel atoms in the Titanium containing silicide metal film on the epitaxially grown source-drain contact region of each of the plurality of FET devices.

3. The method of claim 2, wherein the plurality of FET devices comprises at least one nFET device and at least one pFET device.

4. The method of claim 3, wherein:
the Titanium containing silicide metal film, on the epitaxially grown source-drain contact region of the nFET device, is made of a first silicide metal material;
the Titanium containing silicide metal film, on the epitaxially grown source-drain contact region of the pFET device, is made of a second silicide metal material; and
the first silicide metal material is different from the second silicide metal material.

5. The method of claim 1, wherein the at least one FET device is a plurality of FET devices comprising at least one nFET device and at least one pFET device, and wherein the implanting comprises:
implanting Nickel atoms in the Titanium containing silicide metal film on the epitaxially grown source-drain contact region of the at least one nFET device; and
implanting Nickel atoms in the Titanium containing silicide metal film on the epitaxially grown source-drain contact region of the at least one pFET device.

6. The method of claim 5, wherein:
the Titanium containing silicide metal film, on the epitaxially grown source-drain contact region of the at least one nFET device, comprises a first silicide metal material;
the Titanium containing silicide metal film, on the epitaxially grown source-drain contact region of the at least one pFET device, comprises a second silicide metal material; and
the first silicide metal material is different from the second silicide metal material.

7. The method of claim 1, wherein the implanting comprises:
beamline implanting of Nickel atoms into the Titanium containing silicide metal film on the epitaxially grown source-drain contact region of the at least one FET device.

8. The method of claim 1, wherein the implanting comprises:
plasma doping of Nickel atoms into the Titanium containing silicide metal film on the epitaxially grown source-drain contact region of the at least one FET device.

9. A method for fabricating a semiconductor structure that reduces source-drain contact resistance in nFET devices and/or pFET devices, the method comprising:
depositing a very thin film of Nickel on a Titanium containing silicide metal film on an epitaxially grown source-drain contact region of the at least one FET device; and
using grain boundary diffusion of the Nickel atoms from the very thin film of Nickel into the Titanium containing silicide metal film to transfer Nickel atoms from the very thin film of Nickel to an interface between the Titanium containing silicide metal film and the epitaxially grown source-drain contact region, thereby reducing interfacial contact resistance of the source-drain contact region.

10. The method of claim 1, further comprising:
alloying Titanium containing silicide metal material with a few atomic percent of Nickel atoms to form Titanium Nickel alloy silicide metal material;
depositing this alloy to form a Titanium Nickel alloy silicide metal film on the epitaxially grown source-drain contact region of an FET device; and
using grain boundary diffusion of Nickel atoms in the Titanium Nickel alloy silicide metal film to transfer the Nickel atoms to an interface between the Titanium Nickel alloy silicide metal film and the epitaxially grown source-drain contact region of the FET device, thereby reducing interfacial contact resistance of the source-drain contact region.

11. A method for fabricating a semiconductor structure that reduces source-drain contact resistance in nFET devices and pFET devices, the method comprising:
maskless contemporaneous implanting of Nickel atoms into a Titanium containing silicide metal film on epitaxially grown source-drain contact regions of a plurality of FET devices including at least one nFET device and at least one pFET device, thereby reducing interfacial contact resistance of the epitaxially grown source-drain contact region of each of the plurality of FET devices.

12. The method of claim 11, wherein:
the Titanium containing silicide metal film on the epitaxially grown source-drain contact region of the at least one nFET device is made of a first silicide metal material;
the Titanium containing silicide metal film on the epitaxially grown source-drain contact region of the at least one pFET device is made of a second silicide metal material; and
the first silicide metal material is different from the second silicide metal material.

13. The method of claim 11, wherein the maskless contemporaneous implanting comprises:
beamline implanting of Nickel atoms into the Titanium containing silicide metal film on the epitaxially grown source-drain contact region of the at least one nFET device and the epitaxially grown source-drain contact region of the at least one pFET device.

14. The method of claim 11, wherein the maskless contemporaneous implanting comprises:
plasma doping of Nickel atoms into the Titanium containing silicide metal film on the epitaxially grown source-drain contact region of the at least one nFET device and the epitaxially grown source-drain contact region of the at least one pFET device.

15. The method of claim 11, further comprising:
depositing a very thin film of Nickel on the Titanium containing silicide metal film on the epitaxially grown source-drain contact regions of the plurality of FET devices including the at least one nFET device and the at least one pFET device; and
using grain boundary diffusion of Nickel atoms from the very thin film of Nickel into the Titanium containing silicide metal film to transfer Nickel atoms from the very thin film of Nickel to an interface between the Titanium containing silicide metal film and the epitaxially grown source-drain contact region of each of the plurality of FET devices, thereby reducing interfacial contact resistance of the source-drain contact region.

16. The method of claim 11, further comprising:
depositing a very thin film of Nickel on the Titanium containing silicide metal film on the epitaxially grown source-drain contact region of the at least one nFET device and on the epitaxially grown source-drain contact region of the at least one pFET device; and
using grain boundary diffusion of the Nickel atoms from the very thin film of Nickel into the Titanium containing silicide metal film to transfer implanted Nickel atoms to:
- an interface between the Titanium containing silicide metal film and the epitaxially grown source-drain contact region of the at least one nFET device, thereby reducing interfacial contact resistance of the source-drain contact region of the at least one nFET device; and
- an interface between the Titanium containing silicide metal film and the epitaxially grown source-drain contact region of the at least one pFET device, thereby reducing interfacial contact resistance of the source-drain contact region of the at least one pFET device, and wherein before depositing the very thin film of Nickel on the Titanium containing silicide metal film, the Titanium containing silicide metal film contains no Nickel atoms.

17. The method of claim 11, further comprising:
alloying Titanium containing silicide metal material with a few atomic percent of Nickel atoms to form Titanium Nickel alloy silicide metal material;
depositing this alloy to form a Titanium Nickel alloy silicide metal film on the epitaxially grown source-drain contact regions of the plurality of FET devices; and
using grain boundary diffusion of Nickel atoms in the Titanium Nickel alloy silicide metal film to transfer the Nickel atoms to an interface between the Titanium Nickel alloy silicide metal film and the epitaxially grown source-drain contact region of each of the plurality of FET devices, thereby reducing interfacial contact resistance of the source-drain contact region.

18. The method of claim 11, wherein before the maskless contemporaneous implanting of Nickel atoms into the Titanium containing silicide metal film, the Titanium containing silicide metal film contains no Nickel atoms.

* * * * *